US011159154B2

(12) United States Patent
Kilada et al.

(10) Patent No.: US 11,159,154 B2
(45) Date of Patent: Oct. 26, 2021

(54) POWER GATE RAMP-UP CONTROL APPARATUS AND METHOD

(71) Applicant: Intel Corporation, Santa Clara, CA (US)

(72) Inventors: Eliyah W. Kilada, Portland, OR (US); Christopher P. Mozak, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/466,688

(22) Filed: Mar. 22, 2017

(65) Prior Publication Data

US 2018/0278246 A1 Sep. 27, 2018

(51) Int. Cl.
| H03B 1/00 | (2006.01) |
| H03K 3/00 | (2006.01) |
| H03K 17/14 | (2006.01) |
| H03K 19/0175 | (2006.01) |
| G11C 5/14 | (2006.01) |
| H03K 17/16 | (2006.01) |
| H03K 19/00 | (2006.01) |
| H03K 17/10 | (2006.01) |
| G06F 1/3287 | (2019.01) |

(52) U.S. Cl.
CPC ......... *H03K 17/145* (2013.01); *G06F 1/3287* (2013.01); *G11C 5/148* (2013.01); *H03K 17/102* (2013.01); *H03K 17/163* (2013.01); *H03K 19/0016* (2013.01); *H03K 19/017509* (2013.01)

(58) Field of Classification Search
CPC ......... H03K 17/145; H03K 19/017509; G06F 1/266

USPC .......................................................... 327/108
See application file for complete search history.

(56) References Cited

U.S. PATENT DOCUMENTS

| 2011/0198942 | A1 | 8/2011 | Takayanagi et al. |
| 2011/0320843 | A1 | 12/2011 | Lee et al. |
| 2013/0106494 | A1* | 5/2013 | Takayanagi .......... H03K 17/284 327/434 |
| 2015/0249452 | A1* | 9/2015 | Tan .................... H03K 19/0948 326/34 |
| 2016/0254746 | A1* | 9/2016 | Lerdworatawee ........ H03F 3/21 323/271 |
| 2018/0175832 | A1* | 6/2018 | Sutanthavibul .... H03K 19/0013 |

(Continued)

FOREIGN PATENT DOCUMENTS

| JP | 2008065732 | 3/2008 |
| JP | 2014003594 | 1/2014 |

OTHER PUBLICATIONS

International Search Report and Written Opinion from PCT/US2018/019280 dated Jun. 8, 2018, 14 pgs.

(Continued)

*Primary Examiner* — Metasebia T Retebo
(74) *Attorney, Agent, or Firm* — Schwabe, Williamson & Wyatt, P.C.

(57) ABSTRACT

An apparatus is provided which comprises: a power gate device coupled to a gated power supply node and an ungated power supply node; and a control circuitry coupled to the power gate device, wherein the control circuitry is to turn on the power gate device by providing at least two bias voltages separated in time to gradually turn on the power gate device.

29 Claims, 7 Drawing Sheets

(56) References Cited

U.S. PATENT DOCUMENTS

2020/0258554 A1* 8/2020 Qian .................... G11C 7/1051

OTHER PUBLICATIONS

International Preliminary Report on Patentability from PCT/US2018/019280 dated Oct. 3, 2019, 11 pgs.
Extended European Search Report from European Patent Application No. 18771236.9 dated Dec. 15, 2020, 8 pgs.

* cited by examiner

POWER GATE RAMP-UP CONTROL APPARATUS AND METHOD

BACKGROUND

Power gates are used to control power supply to one or more logic areas. For example, a power gate may be used in a processor to gate (e.g., to enable or disable provision of) power supply to a processing core of the processor. The power gate is generally coupled to gated and ungated power supply nodes, where the gated power supply node is coupled to the processing core while the ungated power supply node is coupled to a power source, in this example.

When a power gate transistor is first turned on, the source to drain voltage difference (Vsd) of the transistor between the gated and ungated power supply nodes is very large. This large Vsd makes the initial ramp-up current through the transistor a challenge because this initial ramp-up current can cause self-heat temperature issues for the transistor silicon. For example, the initial ramp-up current causes the temperature of the power gate silicon to rise above its safe level causing the silicon to overheat resulting in reliability concerns. The initial ramp-up rate of the current may cause di/dt events or excessive IR droop on the supply provided to the gated power supply node. The initial ramp-up rate of the current if not controlled may cause violation of metal reliability limits, and as such the initial ramp-up rate is a constraint for ramping up a power gate transistor. This constraint may limit the minimum size of the power gate transistor that can turn on.

Another constraint associated with ramping a power gate transistor limits the maximum current (Imax) from the power gate transistor to prevent excessive droop or reliability issues on the ungated power supply node (or ungated rail). For example, some circuits may be using the ungated rail while the power gate transistor is turning on, and as such, couple potentially fail due to high droop. This constraint limits the maximum size of the power gate transistor that can turn on. Satisfying these constraints across process, voltage, and temperature (PVT) range is a challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
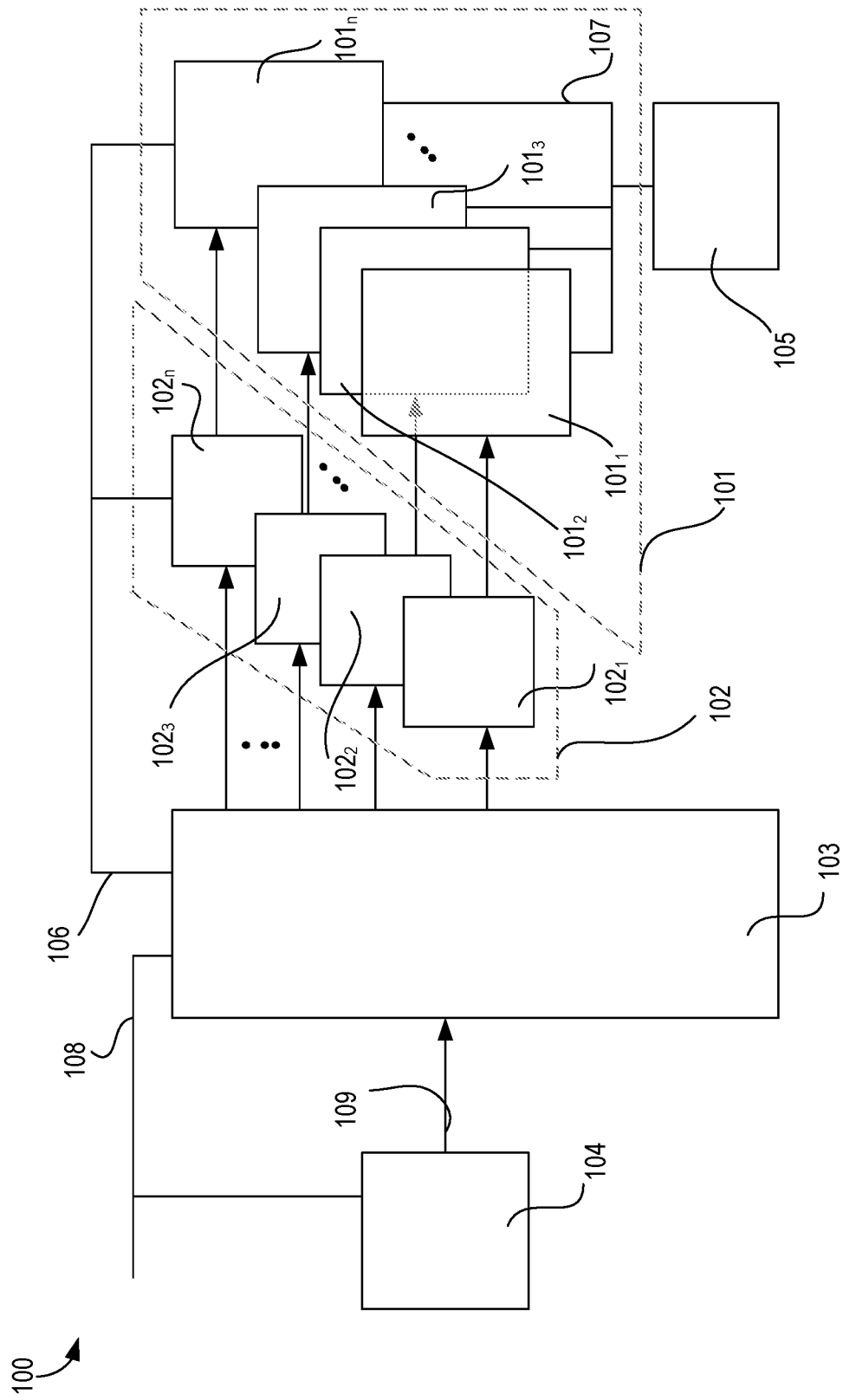
FIG. 1 illustrates a high level architecture of a ramp-up circuitry for ramping slices of power gate transistors, according to some embodiments of the disclosure.

To refrain from violating the various performance parameters (e.g., metal reliability limit, maximum silicon temperature, maximum safe level of the current through a transistor, etc.), the ramp-up current should meet the following two conditions: 1) current per device (e.g., transistor) should be less than the maximum safe current level identified for the process technology node (e.g., $I_{max\_device}$); and 2) the total current (or $I_{aggregate}$) should be less than the maximum active data current (e.g., $I_{max\_active\_data}$) or maximum current set for metal reliability (RV) limit (e.g., $I_{max\_RV}$). One approach to control the initial ramp-up current and avoid violating the various performance parameters is to require a slow ramp-up which is slow enough to not cause a false electro-static discharge (ESD) event trigger.

In one such example, the p-type power gate transistors are biased using all-analog biases to keep an array of power gate transistors biased near the transistor threshold voltage (Vt) throughout the ramp-up event duration. Since the array is biased near the transistor threshold, the ramp-up current density is too small to cause any violation of the performance parameters. However, this approach may be very slow since the bias voltage to the p-type transistors is very weak.

For example, in a 10 nanometer (nm) Complementary Metal Oxide Semiconductor (CMOS) process technology node, and for a 2 nano Farad (nF) load capacitance on the gated power supply node, the ramp-up of voltage on the gated power supply node takes about 1.5 micro seconds (μs) in the worst case process corner. Also, operating near Vt increases the ramp-up time variations across process corners unless some logic and circuit complexity is added for compensation. In the same example above, ramp-up time varies between 100 nanoseconds (ns) to 1.5 μs across process, voltage, and temperature (PVT). Moreover, analog circuit techniques are usually harder to port from one process technology node to another compared to digital circuit solutions, and typically require fuses.

Another approach to control the initial ramp-up current and avoid violating the various performance parameters is to use a more digital approach in which the array of power gate transistors is divided into slices and these slices are progressively turned on in a sequence over time. In one such example, the p-type power gate transistors are biased by half the supply level (e.g., Vdd/2) during ramp-up. Once all power gate transistors are progressively turned on, the bias level is changed from Vdd/2 to a ground level. While this approach avoids violating the various performance parameters and gets rid of a lot of the analog bias complexity, Vdd/2 bias level may be close to Vt. Hence, the ramp-up time may be both very slow in the slow process corner, and, it may also vary significantly among the different PVT process corners. For example, the ramp-up time in the worst case corners, may be about 1 μs for this approach on a 10 nm CMOS process technology node with 2 nF load capacitance on the gated power supply node.

Various embodiments circumvent the issues discussed here by dividing the array of power gate transistors into slices and allowing for more than one discrete ramp-up bias for a power gate transistor to speed up the ramp-up event across all process corners while still avoiding violating the various performance and reliability constraints (hereinafter "performance parameters"). In some embodiments, when the voltage on the gated power supply node is fully ramped-up to its target voltage level, then the array of power gate transistors are biased to a ground level.

There are many technical advantages of the various embodiments. For example, the ramp-up time for the voltage on the gated power supply node using the various embodiments may be 25 times faster than the first approach and about 9 times faster than the second approach. The fast ramp-up time achieved by the various embodiments reduces the power state exit and entrance latencies. For example, various processor cores that are powered by power gates can enter and exit sleep mode state with lower latencies than other known approaches. The apparatus of various embodiments results in low variations across PVT corners for the ramp-up time. For example, by operating the bias voltage to the power gate transistors at much stronger levels than Vt, variations across PVT corners can be reduced. Variation can be measured by a ratio of slowest ramp-up time to the fastest ramp-up time. The first approach discussed here may have a variation ratio of 15 compared to 1-2 for the various embodiments. Some embodiments may employ a mostly digital solution that uses digital control to provide discrete bias voltages to the power gate transistors. By being a digital design, the apparatus of various embodiments by nature is robust, simpler, easier to program, fine tune, and scale across different process technology nodes than the analog alternatives. The digital design of various embodiments is also formally verifiable against a hardware transfer language model (e.g., register transfer level (RTL) based ramp-up logic model). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a high level architecture 100 of a ramp-up circuitry for ramping slices of power gate transistors, according to some embodiments of the disclosure. Architecture 100 comprises a plurality of power gate circuitry or slices of power gates 101, a plurality of drivers 102, bias generator and associated control circuitry 103, finite state machine (FSM) 104, and load 105. Here, 'n' number of slices of power gates 101 are shown. For example, slices $101_1$, $101_2$, $101_3$, . . . $101_n$. In some embodiments, each power gate slice is controlled by an associated driver. For example, power gate slice $101_1$ is controlled by driver $102_1$, power gate slice $101_2$ is controlled by driver $102_2$, power gate slice $101_3$ is controlled by driver $102_3$, and power gate $101_n$ is controlled by driver $102_n$. In some embodiments, each power gate slice is coupled to an ungated power supply node 106 and a gated power supply node 107. In some embodiments, the ungated power supply node 106 receives a power supply from an external source (e.g., battery or external voltage regulator) or an internal source (e.g., internal DC-DC converter or low dropout regulator).

In some embodiments, bias generator and associated control circuitry 103 includes suitable circuitry 103 to generate the discrete bias voltages which are provided to the power gates over a sequence of time to ramp-up the voltage on node 107 such that the ramp-up speed avoids violations of the performance and reliability constraints over all process technology corners. In some embodiments, bias generator and associated control circuitry 103 includes one or more multiplexers that select the bias voltages according to an output 109 of FSM 104.

Figure 4A:
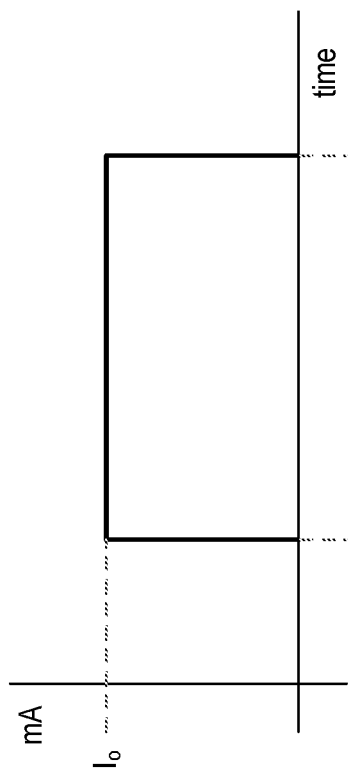
FIGS. 4A-B illustrate plots showing constant current and associated ramp-up voltage on a gated power supply node, respectively, according to some embodiments of the disclosure.
Figure 4B:
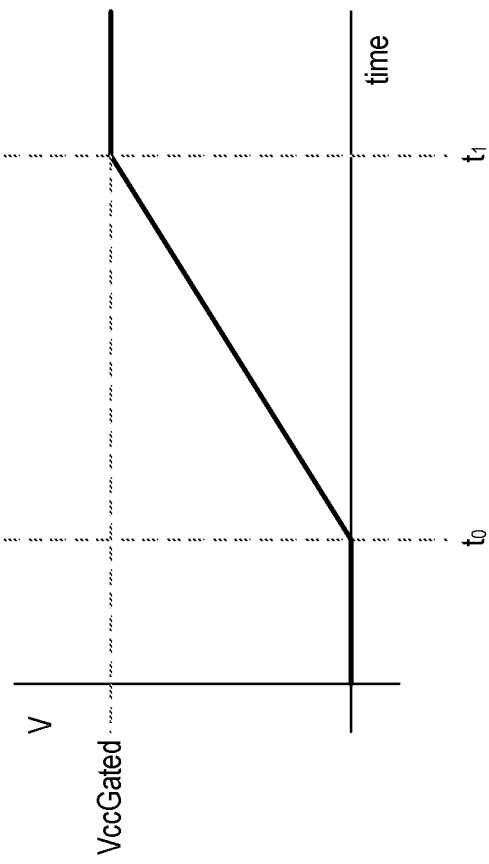

In some embodiments, the bias voltage provided to the power gate approximates a constant current source. A constant current source is a current source that provides a current $I_o$ which is constant across PVT corners and is independent of the power supply level of the gated power supply node 107 as shown with reference to FIG. 4A. FIGS. 4A-B illustrate plots 400 and 420 showing constant current and associated ramp-up voltage on a gated power supply node, respectively, according to some embodiments of the disclosure. Between ramp time point $t_0$ and point $t_1$, the current provided by bias generator and associated control circuitry 103 is constant. If that constant current level is maximized but without exceeding any of the current limits (e.g., $I_{max\_device}$ and/or $I_{max\_RV}$), then the ramp up rate of the gated power supply node 107 is maximized and will cause no reliability or performance issues.

Referring back to FIG. 1, in some embodiments, bias generator and associated control circuitry 103 is operable to provide constant current source while meeting the following conditions: 1) current per power gate device is less than the maximum safe current level identified for the process technology node; and 2) the total current (or $I_{aggregate}$) is less than the maximum active data current (e.g., $I_{max\_active\_data}$) or maximum current set for metal reliability limit (e.g., $I_{max\_RV}$), or ESD. Any suitable constant current source can be used that generates the corresponding bias voltage for the power gate. In one such embodiments, when the voltage on the gated power supply node reaches its desired voltage level, the bias voltage is switched to a ground voltage (weak or strong depending on the reliability margin).

In various embodiments, FSM 104 causes bias generator 103 to use digitally controlled discrete bias for the p-type power gate array 101 that progressively gets stronger to allow the p-type power gate array 101 to ramp up quickly for all PVT corners. While the various embodiments are illustrated with reference to a p-type power gate array 101, the power gate array 101 may include different slices that include one or more of: p-type devices, n-type devices, or a combination of them. In some embodiments, the slices of power gate array 101 are controlled by FSM 104, which may progressively turn on more slices and/or turn on strong biases for the power gate transistors (e.g., resulting in higher current through the power gate array 101). In some embodiments, the proportion of the power gate array that is turned on and the value of the discrete bias are both determined by FSM 104. In some embodiments, as FSM 104 sequences through different ramp-up stages, it progressively forces a stronger bias and turns on more portions of power gate array 101, to maintain near constant (and maximized) ramp-up current.

In some cases, maintaining a constant ramp-up current through the power gate when the gated supply value is approaching that of the ungated supply is difficult for ordinary current sources (since Vsd on the p-type power gate is getting smaller). However, this is compensated by the digital approach of various embodiments by strengthening the bias and turning ON more power gate legs, in accordance with some embodiments. In various embodiments, the values of the bias voltages can be programmable based on post silicon calibration of the processor or integrated circuit using the power gate.

Figure 2:
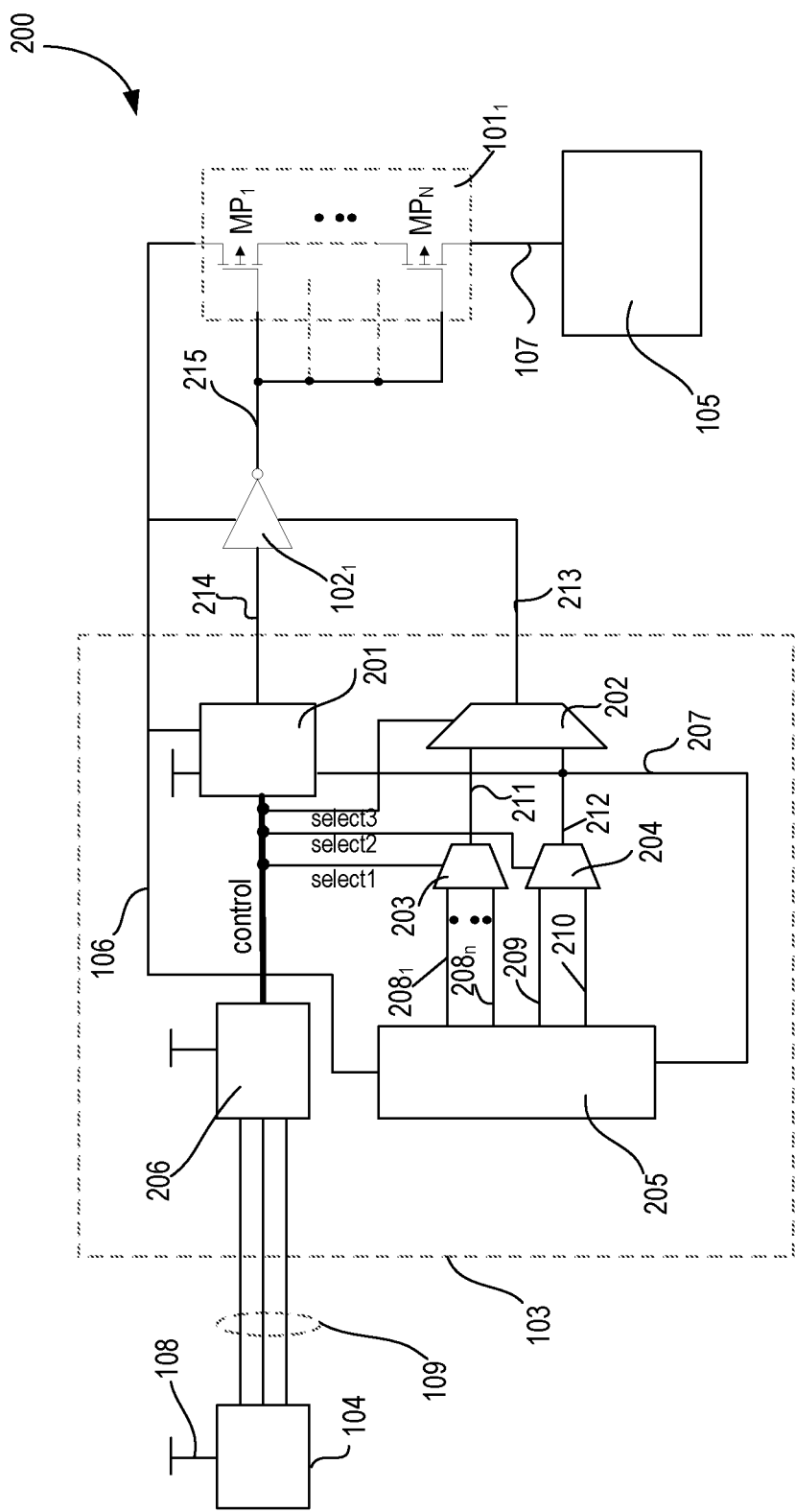
FIG. 2 illustrates an apparatus for ramping a power gate circuitry, according to some embodiments of the disclosure.

FIG. 2 illustrates apparatus 200 for ramping a power gate circuitry, according to some embodiments of the disclosure. It is pointed out that those elements of FIG. 2 having the same reference numbers (or names) as the elements of any other figure can operate or function in any manner similar to that described, but are not limited to such. So as not to obscure the various embodiments, one driver $102_1$ and one power gate circuitry $101_1$ is illustrated. However, the embodiments can be expanded to any number of power gate circuitries as described with reference to FIG. 1.

Referring back to FIG. 2, in some embodiments, power gate circuitry $101_1$ comprises a single p-type transistor (which may be distributed as a parallel set of transistors), where the single p-type transistor has a source terminal coupled to the ungated power supply node 106 and a drain terminal coupled the gated power supply node 107. In some embodiments, power gate circuitry $101_1$ comprises a stack of p-type transistors $MP_1$ through $MP_N$, where 'N' is an integer greater than one.

In some embodiments, driver $102_1$ is an inverter with its power supply node coupled to the ungated power supply node 106 and its ground node coupled to the output of bias generator and control circuitry 103. In some embodiments, the voltage on the ground node of driver $102_1$ determines the bias voltage of the power gate circuitry $101_1$, and directly impacts the ramp-up rate or speed of the voltage on the gated power supply node 107.

In some embodiments, bias generator and control circuitry 103 comprises level-shifter 201, multiplexers 202, 203, and 204, bias generating and/or high voltage analog circuitry 205 (hereinafter circuitry 205), and decoder 206. In some embodiments, circuitry 205 generates biased voltages $208_{1-n}$ (e.g., $vbias_1$, $vbias_2$, ... $vbias_n$) weakvsshi 209 (e.g., poorly-regulated elevated ground), strongvsshi 210 (e.g., well-regulated elevated ground). Here, reference to signal names and node names is interchangeably used. For example, $vbias_1$ or $208_1$ may refer to node $vbias_1$ or $208_1$, or it may refer to signal $vbias_1$ or $208_1$ depending on the context of the sentence. In some embodiments, the voltage level of $vbias_1$ is Vcc/2 or Vdd/2 (e.g., voltage on node 106 divided by two), the voltage level of $vbias_2$ is Vcc/4, and so on. In some embodiments, $vbias_1$ or $208_1$ has a voltage level higher than the voltage level of $vbias_2$ or $208_2$. In some embodiments, $vbias_1$ or $208_1$ is to produce lesser current through the power gate device than current produced by $vbias_2$ or $208_2$. One embodiment of circuitry 205 is illustrated with reference to FIG. 6.

Referring back to FIG. 2, FSM 104 generates one or more control signals 109 for controlling bias generator and control circuitry 103. For example, FSM 104 generates a default state code that identifies which slices of the power gates, how many of them, and the associated bias voltages for the power gates. In some embodiments, FSM 104 may also generate a power good signal to indicate a stable power supply on the ungated power supply node 106. For example, when the power supply (also referred to as VccUngated) on the ungated power supply node 106 has received its desired level, FSM 104 asserts (or de-asserts) a power good signal which enables the ramping of the power gates $101_1$.

In some embodiments, FSM 104 initializes the ramp-up process when it receives a ramp-up request from a power management unit (off-chip or on-die). In some embodiments, the initialization of the ramp-up process can occur at any time and as frequent as needed. In some embodiments, the initialization of the ramp-up process occurs after the ungated supply has stabilized.

In some embodiments, FSM 104 generates a code (e.g., multiple bits) indicating which slices of the power gates to turn on and their associated bias voltages. In some embodiments, the code is an encoded code which is decoded by decoder 206 to generate control bits. For example, the code from FSM 104 is a 3 bit code, and the decoder decodes it to eight bits. In some embodiments, one bit or three separate bits from the decoded control bits is used to control multiplexers 202, 203, and 204. For example, select1, select2, and select3 bits from control bits are used to control (e.g., select) multiplexers 203, 204, and 202, respectively.

For example, to ramp up power gate $101_1$ from a fully OFF state to a fully ON state, FSM 104 advances the 3 bit code (e.g., code[2:0]) in a gray code fashion from "000" to "111" for a total of 8 steps (including all'0s and all'1s). In some embodiments, each ramp-up step/code lasts for a predefined synchronized interval (e.g., approximately 20 ns). However, the number of steps and the step duration can both be chosen arbitrarily. In some embodiments, debug hooks can be added to program the step interval. The 3-bit bus (e.g., one of the lines of 109) gets decoded into a set of digital control signals that control the state of power gate $101_1$.

While various embodiments are described with reference to 'n' number of bias voltages, apparatus 200 for ramping a power gate circuitry can also operate when n=1. In some embodiments, a single vbias (e.g., $vbias_1$) is chosen based on post silicon calibration and applied to the power gate during the ramp-up duration. For example, for faster dies may use a higher value for $vbias_1$ (e.g., weaker biasing for the p-type power gate) while slower dies may use a lower value of $vias_1$ (e.g., stronger biasing for the p-type power gate). In some embodiments, the value of this single vbias is still an output of a multiplexer (e.g., multiplexers 202, 203, and 204), but the vbias multiplexer control, in this case, may not change during ramp up. In one such embodiment, the vbias multiplexer control may always select the same vbias (during ramp-up) based on post-silicon calibration (stored in a control register). Once a determination is made about the process corner of the post silicon die, the multiplexer can be programed to always pick a particular vbias to be chosen during the whole ramp-up duration. For example, the multiplexer may always pick vdd/2 as vbias for fast corners, vdd/4 for vbias for slow corners, and vdd/3 for vbias for typical corners. In some embodiments, vbias may be generated by a process independent current source and the multiplexer controls one or more internal aspects of the current source generator such as transistor widths, resistor sizes, etc.

Figure 3:
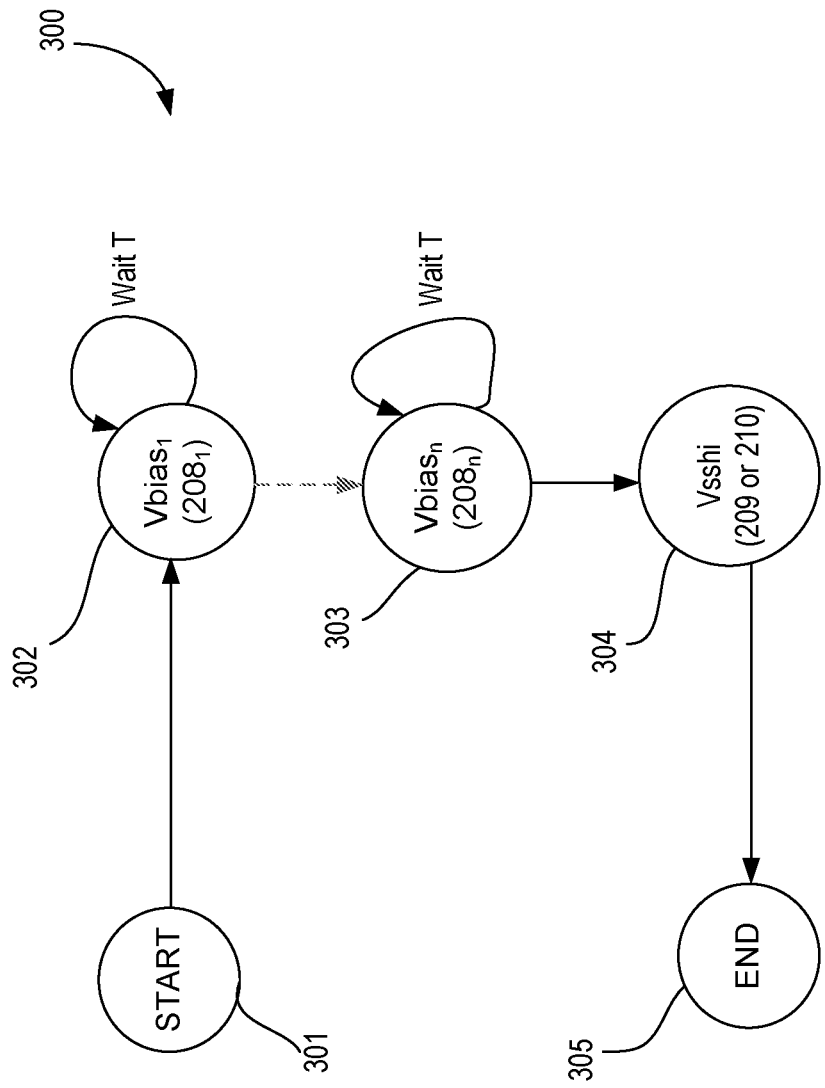
FIG. 3 illustrates a flowchart or a finite state machine (FSM) for controlling the ramping of the power gate circuitry, according to some embodiments of the disclosure.

FIG. 3 illustrates flowchart 300 or operation of FSM 104 for controlling the ramping of the power gate circuitry, according to some embodiments of the disclosure. It is pointed out that those elements of FIG. 3 having the same reference numbers (or names) as the elements of any other figure can operate or function in any manner similar to that described, but are not limited to such. Here, five states are shown—301, 302, 303, 304, and 305. FSM 104 begins at state 301 in which after power good is asserted (e.g., when voltage on node 106 is at its desired level), the Start state begins and proceeds to state 302.

In some embodiments, FSM 104 begins state 301 when it receives a ramp-up request from a power management unit (off-chip or on-die). In some embodiments, FSM 104 begins state 301 at any time and as frequent as needed. In some embodiments, FSM 104 begins state 301 after the ungated supply has stabilized.

At state 302, FSM 104 generates a control code that causes multiplexer 203 to select $vbias_1$ $208_1$. As such, node 215 is provided a voltage close to or at $vbias_1$ to bias power gate $101_1$. FSM 104 then waits in state 302 for 'T' seconds, and then the FSM 104 moves to state 303. In some embodiments, the duration of 'T' is programmable (e.g., by software or hardware).

In this example, a dotted line between states 302 to 303 indicates any number of intermediate states for different vbias levels. For example, $vbias_2$, $vbias_3$, and so on are provided to node 215. At state 303, FSM 104 generates a control code that causes multiplexer 203 to select $vbias_n$ $208_n$. As such, node 215 is provided a voltage close to or at $vbias_n$ to bias power gate $101_1$. FSM 104 then waits in state 303 for 'T' seconds, and then the FSM 104 moves to state 304. At state 304, voltage level on node 107 reaches its predetermined level and FSM 104 generates a control code that causes multiplexer 202 to select signal on node 212 (e.g., weak or strong Vsshi 209 or 210) and as such that signal is provided to node 213. The FSM 104 then proceeds to state 305 where the ramping process ends. In some embodiments, the value of time 'T' for different states can be the same or different values, and can be programmable or predetermined.

Referring back to FIG. 2, in some embodiments, multiplexer 203 provides a selection of one of the discrete bias voltages $208_1$-$208_n$ to node 211. The selected bias voltage is then provided to multiplexer 202. In some embodiments, multiplexer 204 provides one of the weakvsshi 209 (e.g., a poorly-regulated elevated ground) or strongvsshi 210 (e.g., well-regulated elevated ground) to node 212. In some embodiments, multiplexer 202 selects one of signals on nodes 211 or 212 and drives it on node 213. One reason for having "weak" and "strong" vsshi signals 209 and 210, respectively, is to save leakage power consumption during the "OFF" state of power gate 101 while minimizing the IR drop across power gate 101 in the "ON" state. In one example, strong vsshi is a well-driven vsshi signal of a value=vdd/6. In some embodiments, strongvsshi 210 is used when power gate $101_1$ is fully ON to provide a strong drive. In some embodiments, weakvsshi 209 is to provide a safe voltage level (e.g., a voltage level which does not cause harm to the underlying silicon) for the level shifter 201 when the power gate $101_1$ is OFF. In some embodiments, circuitry 205 which generates $vbias_{1-n}$, weakvsshi, and strongvsshi are power gated when they are not used to save power/leakage. Any suitable level shifter circuitry can be used for implementing level shifter 201.

In some embodiments, during ramp-up time, multiplexer 202 provides a bias voltage (e.g., one of the selected discrete bias voltages $208_1$-$208_n$) to the ground node of inverter $102_1$. After a predetermined time, FSM 104 updates the control bits that cause multiplexer 203 to select the next discrete bias voltage which is provided by multiplexer 202 to node 213. As such, inverter $102_1$ ramps down the voltage on node 215 to increase drive strength of power gate $101_1$. In various embodiments, the output 215 swings between the voltage levels of node 106 and node 213. In some embodiments, for power gate $101_1$ to be fully off, the voltage driven on node 215 is the same as the voltage on node 106.

In various embodiments, when power gate $101_1$ ramps up the voltage in node 107 to a predetermined level (e.g., expected voltage level of supply) then multiplexer 202 selects the signal on node 212 for ground node 213. For example, one of weakvsshi 209 or strongvsshi 210 is provided to node 212. In some embodiments, depending on the voltage supply level on the ungated supply node 106, either weakvsshi 209 or strongvsshi 210 is provided to ground node 213. One reason for providing a raised ground level for ground node 213 is to reduce stress across the oxides of transistor(s) of inverter $102_1$. In one example, when the supply voltage on node 106 is same as the nominal voltage Vdd 108, then the ground node 213 of inverter $102_1$ is provided a voltage level which is near or at ground level (e.g., 0V).

Table 1 shows an example of ramping four slices of power gates (e.g., slices $101_{1-4}$) based on a 3-input bus provided by FSM 104.

TABLE 1 e.g., Ramping up four slices $101_{1-4}$

| State name | Control bus | Voltage on node 213 | Node 215 | Slice0 (3%) $101_1$ | Slice2 (1%) $101_2$ | Slice3 (2%) $101_3$ | Slice4 (94%) $101_4$ |
|---|---|---|---|---|---|---|---|
| OFF | "000" | Weakvsshi 209 | vcchbm_hv | 0 | 0 | 0 | 0 |
| RAMPUP0 | "001" | vddby2 $208_1$ | vddby2 | 1 | 0 | 0 | 0 |
| RAMPUP1 | "011" | vddby2 $208_1$ | vddby2 | 1 | 0 | 0 | 0 |
| RAMPUP2 | "010" | vddby2 $208_1$ | vddby2 | 1 | 1 | 0 | 0 |
| RAMPUP3 | "110" | vddby4 $208_2$ | vddby4 | 1 | 1 | 0 | 0 |
| RAMPUP4 | "100" | vddby4 $208_2$ | vddby4 | 1 | 1 | 1 | 0 |
| RAMPUP5 | "101" | vddby4 $208_2$ | vddby4 | 1 | 1 | 1 | 1 |
| ON | "111" | Strongvsshi 210 | Strongvsshi | 1 | 1 | 1 | 1 |

In this example, not only does the power gate array 101 driver output 215 is changed during the ramp-up but also the portions or slices of the power gate array 101 that is turned ON. As another design knob of controlling the ramp-up current, the power gate array 101 in this example is divided into 4 slices, indexed 1, 2, 3, and 4. In this example, the slices $101_{1-4}$ comprise 3%, 1%, 2%, and 94% of the area of power gate array 101, respectively. Note, that the number of slices and their sizes can both be chosen arbitrarily and four is chosen here to describe the embodiments. Continuing with the example, the slices get turned ON incrementally as the power gate ramp-up code increments from all 0's (e.g., fully OFF) to all 1's (e.g., fully ON). Table 1 also shows the different slice turn-on times with respect to the input 3-bit control bus. Here, a '0' for a slice means it's turned OFF and a '1' means it's turned ON.

In some embodiments, during the OFF state, all slices are OFF where their p-type gate terminals are tied to VccUn-Gated, which is the voltage on the ungated supply node 106. In the first ramp-up step RAMPUP0, the 3-bit control bus switches to "001". In this step, vddby2 (or $vbias_1$ $208_1$) is used to turn ON 3% of the power gate array (e.g., slice 0). This guarantees that the performance and reliability constraints are not violated during the initial ramp-up. Next event occurs in RAMPUP2 state when the 3-bit control bus switches to "011". In this step, again vddby2 (or $vbias_1$ $208_1$) is used to turn ON an extra 1% of the power gate array (e.g., slice1). Next event occurs in RAMPUP3 state (e.g., halfway through ramp-up) when the 3-bit control bus switches to "010". In this step, the gated supply on node 107 (e.g., VccGated) is high enough (e.g., the Vsd of the p-type device in power gate $101_1$ is small enough) to avoid any violations of the performance and reliability constraints.

Hence, in RAMPUP3 state, the ramp-up supply switches from vddby2 to vddby4 to allow for a stronger driver current and faster ramp-up across all process corners. In RAMPUP4 state, vddby4 is used to turn ON an extra 2% of the array (e.g., slice3). In RAMPUP5 state, vddby4 is used to turn ON the rest of the power gate array (e.g., slice4—94% of the array). Finally, in the fully ON state, the power gate array driver node 215 is driven to a strongvsshi value (e.g., vddby6) to reduce the IR drop across the power gate array during normal operation.

Figure 5A:
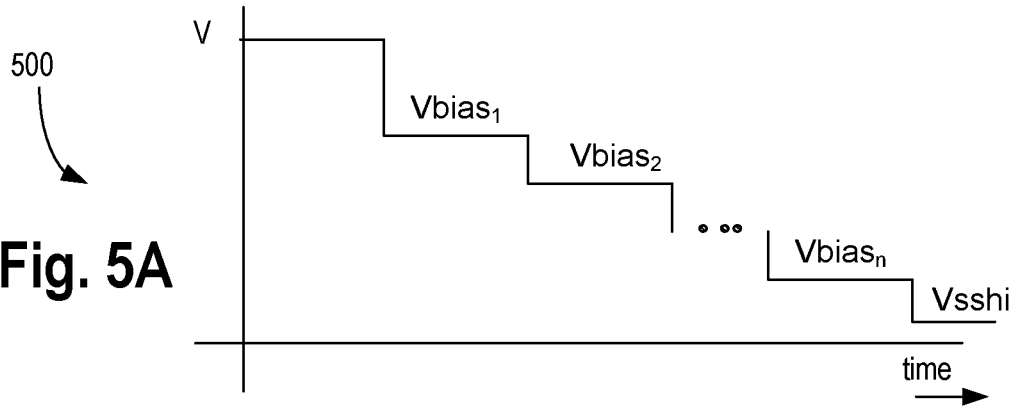
FIGS. 5A-C illustrate plots showing ramping of bias voltages that result in near constant or constant current supply which in turn results in faster ramp-up time of the voltage on the gated power supply node, according to some embodiments.
Figure 5B:
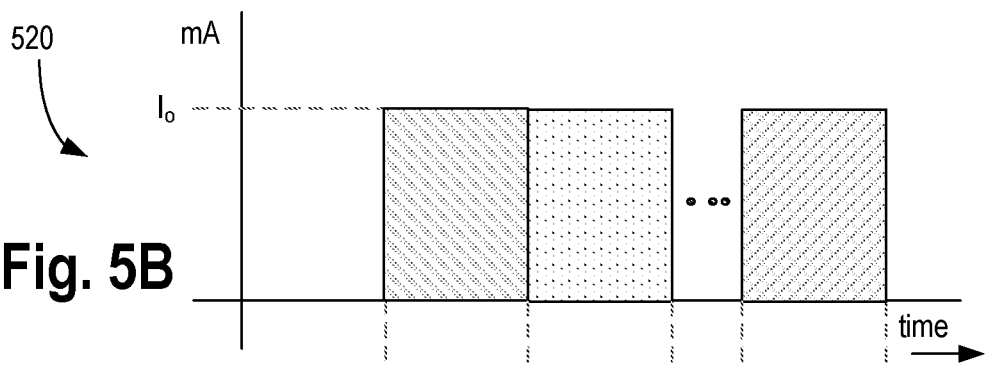
Figure 5C:
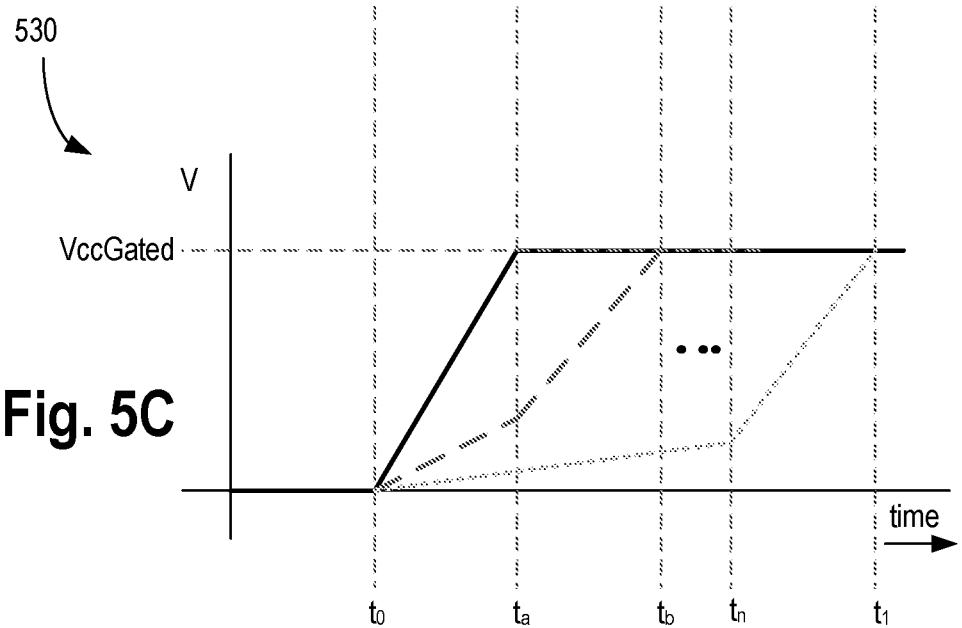

FIGS. 5A-C illustrate plots 500, 520, and 530, respectively, showing ramping of bias voltages that result in near constant or constant current supply which in turn results in faster ramp-up time of the voltage on the gated power supply node, according to some embodiments. It is pointed out that those elements of FIGS. 5A-C having the same reference numbers (or names) as the elements of any other figure can operate or function in any manner similar to that described, but are not limited to such. Here, plot 500 shows the selection of discrete bias voltages $Vbias_{1-n}$ over time and then to Vsshi (when the voltage on node 107 reaches its normal level). Plot 520 shows the constant current $I_0$ provided during every vbias state. As such, faster ramp-up time for realizing the desired voltage level on node 107 is achieved. Plot 530 shows the ramp up behavior of the voltage on node 107 of different process, voltage, and temperature (PVT) corners during different vbias levels between times $t_0$ through $t_1$.

Figure 6:
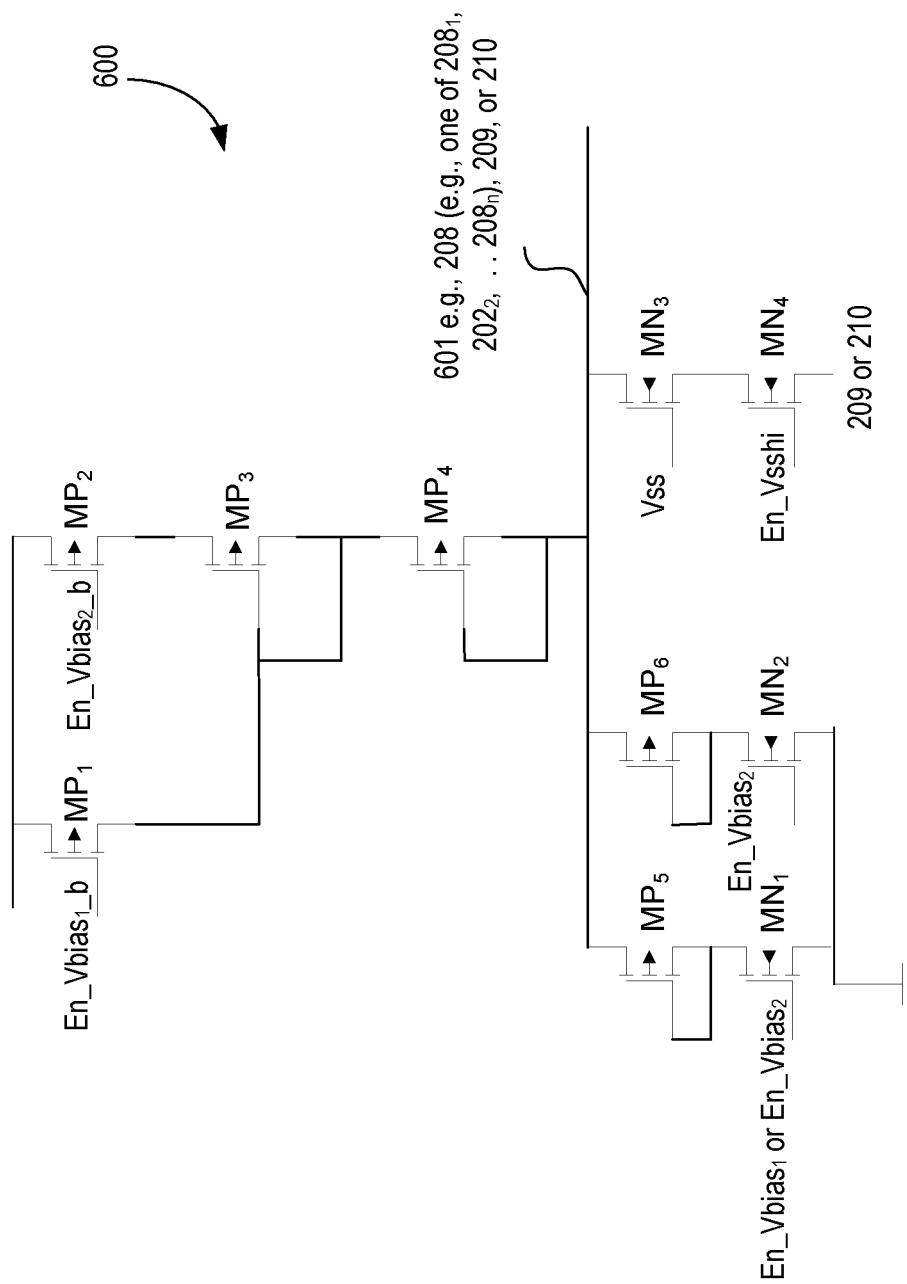
FIG. 6 illustrates a circuit to generate the various bias voltages, according to some embodiments of the disclosure.

FIG. 6 illustrates circuit 600 (e.g., circuitry 205) to generate the various bias voltages (e.g., $vbias_1$, $vbias_2$, $vbias_n$, strongvsshi, etc.), according to some embodiments of the disclosure. It is pointed out that those elements of FIG. 6 having the same reference numbers (or names) as the elements of any other figure can operate or function in any manner similar to that described, but are not limited to such. Circuit 600 comprises p-type transistors $MP_1$, $MP_2$, $MP_3$, $MP_4$, $MP_5$, and $MP_6$; n-type transistors $MN_1$, $MN_2$, $MN_3$, and $MN_4$; and node 601 coupled together as shown. Here node 601 is one of nodes $208_{1-n}$, 209, or 210. Gate terminal of transistor $MP_1$ receives $EN\_Vbias_1$ (enable $Vbias_1$), gate terminal of transistor $MP_2$ receives $En\_Vbias_2\_b$ (which is inverse of $En\_Vbias_2$), gate terminal of transistor $MN_1$ receives $EN\_Vbias_1$ or $En\_Vbias_2$, gate terminal of transistor $MN_2$ receives $EN\_Vbias_2$, gate terminal of transistor $MN_3$ receives a voltage slightly above ground, gate terminal of transistor $MN_4$ receives $En\_Vsshi$, and the source terminal of transistor $MN_3$ receives one of 209 or 210.

In some embodiments, transistors $MP_1$, $MP_2$, $MN_1$, $MN_2$, $MN_3$, and $MN_4$ are digital transistors in that they are either turned on or off completely by the signals controlling their gate terminals. The remaining transistors in circuit 600 are diode-connected and are used to divide the high voltage supply on node 106 to generate vddby2 (e.g., $vbias_1$) and vddby4 (e.g., $vbias_2$).

In some embodiments, when circuit 600 is to provide vddby2, (e.g., vdd/2, then $En\_Vbias_1$=HI, $En\_Vbias_1\_b$=LO, $En\_Vbias_2\_$=LO, $En\_Vbias_2\_b$=HI), transistors $MP_1$ and $MN_1$ are ON and transistors $MP_2$ and $MN_2$ are OFF. Here, "HI" indicates logic high while "LO" indicates logic low. Diode-connected transistors $MP_4$ and $MP_5$ are used to divide the high voltage supply on node 106 by two. When circuit 600 is to provide vddby4 (e.g., Vdd/4, then $En\_Vbias_1$=LO, $En\_Vbias_1\_b$=HI, $En\_Vbias_2$=HI, En_Vbias$_2$_b=LO), transistor MP$_1$ is now OFF and, transistors MP$_2$, MN$_1$, and MN$_2$ are ON. Diode-connected transistors, MP$_3$, MP$_4$, MP$_5$, and MP$_6$ are used to divide the high voltage supply on node 106 by four.

Figure 7:
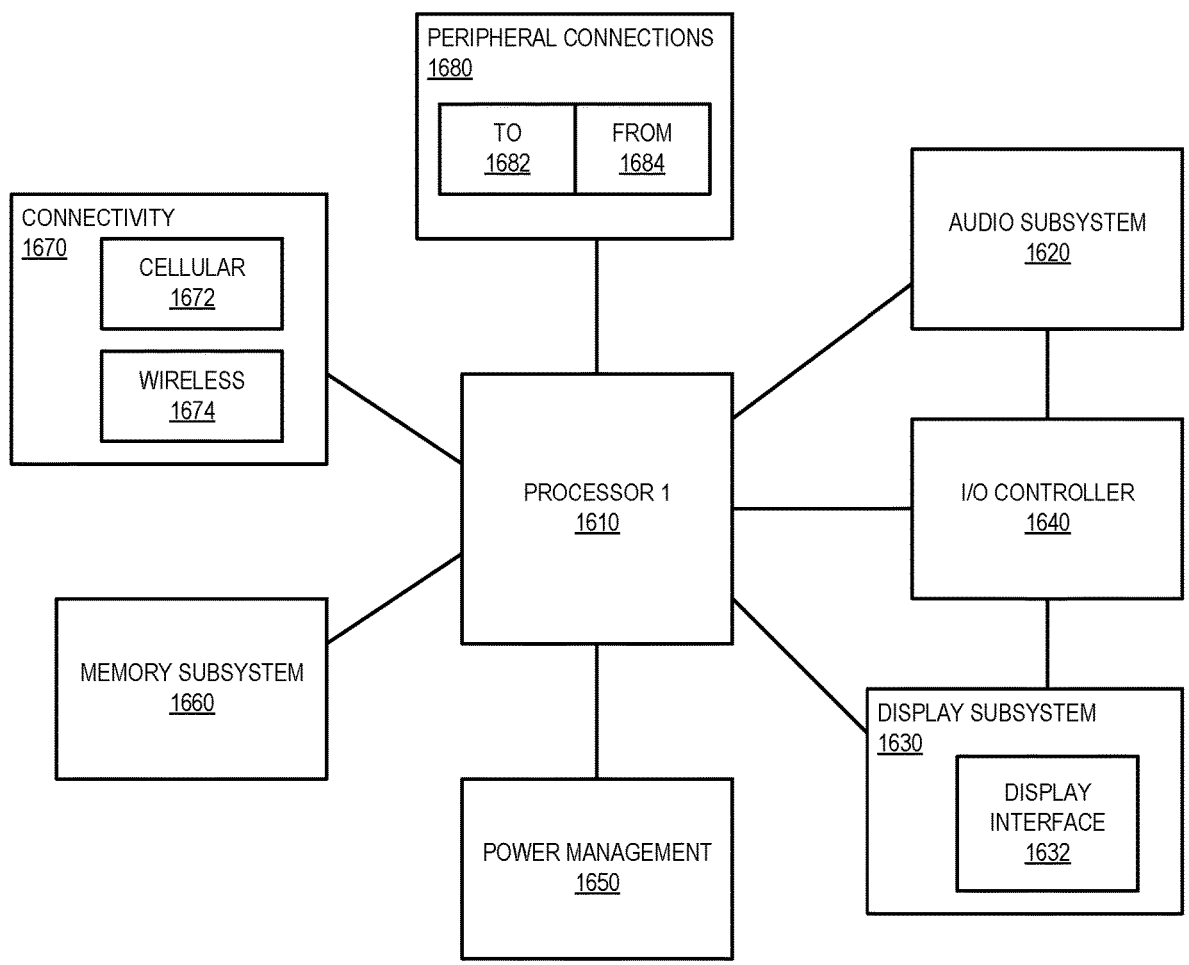
FIG. 7 illustrates a smart device or a computer system or a SoC (System-on-Chip) with a power gate ramp-up circuit, according to some embodiments.

FIG. 7 illustrates a smart device or a computer system or a SoC (System-on-Chip) with a power gate ramp-up circuit, according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with one or more power gate ramp-up circuits, according to some embodiments discussed. Other blocks of the computing device 1600 may also include the power gate ramp-up circuit, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. Various embodiments here can be can be combined with any of the other embodiments thereby allowing various combinations.

Example 1 is an apparatus which comprises: a power gate device coupled to a gated power supply node and an ungated power supply node; and a control circuitry coupled to the power gate device, wherein the control circuitry is to turn on or off the power gate device by providing at least two bias voltages separated in time to gradually turn on or off the power gate device.

Example 2 includes all features of example 1, wherein the power gate device comprises a plurality of devices grouped as slices.

Example 3 includes all features of example 2, wherein the control circuitry is to enable or disable at least two slices, from the plurality of slices, over time to gradually turn on or off the at least two slices.

Example 4 includes all features of example 3, wherein at least one device of the plurality comprises at least two transistors coupled in series such that their respective gate terminals are coupled together, and wherein the at least one device is coupled to the gated or ungated power supply nodes.

Example 5 includes all features of example 2, wherein at least one device of the plurality comprises a single transistor, and wherein the at least one device is coupled to the gated or ungated power supply nodes.

Example 6 includes all features of example 1, wherein the at least two bias voltages include a first bias voltage and a second bias voltage.

Example 7 includes all features of example 6, wherein the first bias voltage is higher than the second bias voltage.

Example 8 includes all features of example 6, wherein the first bias voltage is to produce lesser current through the power gate device than current produced by the second bias voltage.

Example 9 includes all features of example 1, wherein the control circuitry comprises: a driver coupled to the power gate device; and a finite state machine to control the driver.

Example 10 includes all features of example 1, wherein the driver is coupled to the ungated power supply node, and wherein a low power supply node of the driver is to receive the least two bias voltages.

Example 11 includes all features of example 10, wherein the control circuitry comprises one or more multiplexers which are operable to select one of the least two bias voltages.

Example 12 is an apparatus which comprises: a power gate circuitry coupled to an ungated power supply node; a driver coupled to the power gate circuitry and the ungated power supply node; a level-shifter to generate a control signal which is received by the driver, wherein the driver comprises: a pull-up device coupled to the ungated power supply node, wherein the pull-up device is to receive the control signal; and a pull-down device coupled in series with the p-type device, wherein the pull-down device has a source terminal which is to receive at least two bias voltages separated in time to gradually turn on the power gate circuitry.

Example 13 includes all features of example 12, wherein the pull-up device includes one of a: p-type device, n-type device, or a combination of both, and wherein the pull-down device includes one of: p-type device, n-type device, or a combination of both.

Example 14 includes all features of example 12, wherein the at least two bias voltages include a first bias voltage and a second bias voltage.

Example 15 includes all features of example 12, wherein the first bias voltage is higher than the second bias voltage or wherein the first bias voltage is to produce lesser current through the power gate device than current produced by the second bias voltage.

Example 16 includes all features of example 12, wherein the apparatus of example 15 comprises one or more multiplexers which are operable to select one of the least two bias voltages.

Example 17 includes all features of example 12, wherein the power gate circuitry comprises a plurality of devices grouped as slices.

Example 18 includes all features of example 12, wherein the power gate circuitry is coupled to a gated power supply node.

Example 19 includes all features of example 18, wherein the gated power supply node is coupled to a load.

Example 20 is a system which comprises: a memory; a processor coupled to the memory, wherein the processor includes: a first processing core; and a second processing core, wherein the first processing core is to be powered by a first gated power supply node, and wherein the second processing core is to be powered by a second gated power supply node, a first power gate circuitry coupled to the first gated power supply node; a second power gate circuitry coupled to the second gated power supply node, wherein at least one of the first or second power gate circuitry comprises: a power gate device; and a control circuitry coupled to the power gate device, wherein the control circuitry is to turn on the power gate device by providing at least two bias voltages separated in time to gradually turn on the power gate device; and a wireless interface to allow the processor to communicate with another device.

Example 21 includes all features of example 20, wherein the power gate device comprises a plurality of devices grouped as slices.

Example 22 includes all features of example 20, wherein the control circuitry is to enable or disable at least two slices, from the plurality of slices, over time to gradually turn on or off the at least two slices.

Example 23 includes all features of example 20, wherein at least one device of the plurality comprises at least two transistors coupled in series such that their respective gate terminals are coupled together, or wherein at least one device of the plurality comprises a single transistor, and wherein the at least one device is coupled to either the gated or ungated power supply nodes.

Example 24 includes all features of example 20, wherein the at least two bias voltages include a first bias voltage and a second bias voltage.

Example 25 includes all features of example 24, the at least two bias voltages include a first bias voltage and a second bias voltage.

Example 26 includes all features of example 24, wherein the first bias voltage is higher than the second bias voltage or wherein the first bias voltage is to produce lesser current through the power gate device than current produced by the second bias voltage.

Example 27 includes all features of example 20, wherein the control circuitry comprises: a driver coupled to the power gate device; and a finite state machine to control the driver.

Example 28 includes all features of example 20, wherein the driver is coupled to the ungated power supply node, and wherein a low power supply node of the driver is to receive the least two bias voltages.

Example 29 is an apparatus which comprises: a power gate device coupled to a gated power supply node and an ungated power supply node; and a control circuitry coupled to the power gate device, wherein the control circuitry is to turn on the power gate device by providing a programmable bias voltage to the power gate device.

Example 30 includes all features of example 29, wherein the control circuitry comprises: a driver coupled to the power gate device; and a finite state machine to control the driver.

Example 31 includes all features of example 29, wherein the power gate circuitry is coupled to a gated power supply node, and wherein the gated power supply node is coupled to a load.

Example 32 is a method which comprises: turning on or off a power gate device by providing at least two bias voltages separated in time to gradually turn on or off the power gate device, wherein the power gate device coupled to a gated power supply node and an ungated power supply node.

Example 33 includes all features of example 32, wherein the power gate device comprises a plurality of devices grouped as slices.

Example 34 includes all features of example 33, wherein the method of example 34 comprises: enabling or disabling at least two slices, from the plurality of slices, over time to gradually turn on or off the at least two slices.

Example 35 includes all features of example 33, wherein at least one device of the plurality comprises at least two transistors coupled in series such that their respective gate terminals are coupled together, and wherein the at least one device is coupled to the gated or ungated power supply nodes.

Example 36 includes all features of example 33, wherein at least one device of the plurality comprises a single transistor, and wherein the at least one device is coupled to the gated or ungated power supply nodes.

Example 37 includes all features of example 32, wherein the at least two bias voltages include a first bias voltage and a second bias voltage.

Example 38 includes all features of example 37, wherein the method of example 38 comprises: providing a higher voltage as the first bias voltage than the second bias voltage.

Example 39 includes all features of example 37, wherein the method of example 37 comprises: producing a lesser current through the power gate device than current produced by the second bias voltage.

Example 40 includes all features of example 32, wherein the method of example 40 comprises receiving the least two bias voltages.

Example 41 includes all feature of example 40, wherein the method of example 40 comprises: selecting the one of the least two bias voltages.

Example 42 is an apparatus comprising means for performing any of the examples 32 to 41.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a power gate device coupled to a gated power supply node and an ungated power supply node; and
   a control circuitry coupled to the power gate device, wherein the control circuitry is to turn on or off the power gate device with at least two bias voltages that are applied separated in time to gradually turn on or off the power gate device, wherein each of the at least two bias voltages has a different voltage level between a power supply voltage level and a ground level, wherein the control circuitry applies the at least two bias voltages such that a constant current flows through the power gate device during application of each of the at least two bias voltages to the power gate device, wherein the at least two bias voltages are non-zero voltages, wherein the control circuitry is coupled to the power gate device via a driver, wherein a high-power supply node of the driver is coupled to the ungated power supply node, and wherein a low-power supply node of the driver is to receive one of the least two bias voltages;
   one or more multiplexers to selectively provide one of the at least two bias voltages to the low-power supply node to adjust voltage swing of an output of the driver;
   a finite state machine to generate a code; and
   a decoder to decode the code and to generate a decoded code to control the one or more multiplexers.

2. The apparatus of claim 1, wherein the power gate device comprises a plurality of devices grouped as slices.

3. The apparatus of claim 2, wherein the control circuitry is to enable or disable at least two slices, from the plurality of slices, over time to gradually turn on or off the at least two slices.

4. The apparatus of claim 2, wherein at least one device of the plurality comprises at least two transistors coupled in series such that their respective gate terminals are coupled together, and wherein the at least one device is coupled to the gated or ungated power supply nodes.

5. The apparatus of claim 2, wherein at least one device of the plurality comprises a single transistor, and wherein the at least one device is coupled to the gated or ungated power supply nodes.

6. The apparatus of claim 1, wherein the at least two bias voltages include a first bias voltage and a second bias voltage.

7. The apparatus of claim 6, wherein the first bias voltage is higher than the second bias voltage.

8. The apparatus of claim 6, wherein the first bias voltage is to produce lesser current through the power gate device than current produced by the second bias voltage.

9. The apparatus of claim 1, wherein the finite state machine controls the control circuitry to control the driver.

10. The apparatus of claim 1, wherein the control circuitry comprises one or more multiplexers which are operable to select one of the least two bias voltages.

11. An apparatus comprising:
    a power gate circuitry coupled to an ungated power supply node;
    a driver coupled to the power gate circuitry and the ungated power supply node;
    a logic to generate a signal to control the driver;
    a level-shifter coupled to the logic, wherein the level-shifter is to level-shift the signal to generate a control signal which is received by the driver, wherein the driver comprises:
       a pull-up device coupled to the ungated power supply node, wherein the pull-up device is to receive the control signal; and
       a pull-down device coupled in series with a p-type device, wherein the pull-down device has a source terminal which is to receive at least two bias voltages that are applied separated in time to gradually turn on the power gate circuitry, and wherein each of the at least two bias voltages has a different voltage level between a power supply voltage level and a ground level, wherein the at least two bias voltages cause a near constant current flow through the power gate device during application of each of the at least two bias voltages to the power gate device, wherein the at least two bias voltages are non-zero voltages, wherein the apparatus further comprises:
    one or more multiplexers to selectively provide one of the at least two bias voltages to the source terminal of the pull-down device to adjust voltage swing of an output of the driver;
    a finite state machine to generate a code; and
    a decoder to decode the code and to generate a decoded code to control the one or more multiplexers.

12. The apparatus of claim 11, wherein the pull-up device includes one of a: p-type device, n-type device, or a combination of both, and wherein the pull-down device includes one of: p-type device, n-type device, or a combination of both.

13. The apparatus of claim 11, wherein the at least two bias voltages include a first bias voltage and a second bias voltage.

14. The apparatus of claim 11, wherein the first bias voltage is higher than the second bias voltage or wherein the first bias voltage is to produce lesser current through the power gate device than current produced by the second bias voltage.

15. The apparatus of claim 11 wherein the one or more multiplexers are operable to select one of the at least two bias voltages.

16. The apparatus of claim 11, wherein the power gate circuitry comprises a plurality of devices grouped as slices.

17. The apparatus of claim 11, wherein the power gate circuitry is coupled to a gated power supply node.

18. The apparatus of claim 17, wherein the gated power supply node is coupled to a load.

19. A system comprising:
a memory;
a processor coupled to the memory, wherein the processor includes:
a first processor core; and
a second processor core, wherein the first processor core is to be powered by a first gated power supply node, and wherein the second processor core is to be powered by a second gated power supply node, wherein the processor includes:
a first power gate circuitry coupled to the first gated power supply node;
a second power gate circuitry coupled to the second gated power supply node, wherein at least one of the first or second power gate circuitry comprises:
a power gate device; and
a control circuitry coupled to the power gate device, wherein the control circuitry is to turn on the power gate device with at least two bias voltages that are applied separated in time to gradually turn on the power gate device, and wherein each of the at least two bias voltages has a different voltage level between a power supply voltage level and a ground level, wherein the control circuitry applies the at least two bias voltages such that a near constant current flows through the power gate device during application of each of the at least two bias voltages to the power gate device, wherein the at least two bias voltages are non-zero voltages, wherein the control circuitry is coupled to the power gate device via a driver, wherein the driver has a high-supply node which is coupled to the ungated power supply node, and wherein a low-power supply node of the driver is to receive the least two bias voltages;
one or more multiplexers to selectively provide one of the at least two bias voltages to the low-power supply node of the driver to adjust voltage swing of an output of the driver;
a finite state machine to generate a code; and
a decoder to decode the code and to generate a decoded code to control the one or more multiplexers; and
a wireless interface to allow the processor to communicate with another device.

20. The system of claim 19, wherein the power gate device comprises a plurality of devices grouped as slices.

21. The system of claim 19, wherein the control circuitry is to enable or disable at least two slices, from the plurality of slices, over time to gradually turn on or off the at least two slices.

22. An apparatus comprising:
a plurality of power gate devices coupled to a gated power supply node and an ungated power supply node; and
a plurality of drivers coupled to the plurality of power gate devices such that an individual driver is to turn on or off an individual power gate device, wherein the plurality of drivers is to turn on the plurality of power gate devices such that a ramp-up current into the gated power supply node is substantially constant, wherein the driver applies at least two bias voltages such that a near constant current flows through the power gate device during application of each of the at least two bias voltages to the power gate device, wherein a low power supply node of the individual driver is to receive the least two bias voltages, wherein the at least two bias voltages are non-zero voltages;
wherein the plurality of power gate devices includes a first power gate slice, a second power gate slice, a third power gate slice, and a fourth power gate slice,
wherein the first power gate slice occupies about a first percentage of a total area of the plurality of power gate devices,
wherein the second power gate slice occupies about a second percentage of the total area of the plurality of power gate devices,
wherein the third power gate slice occupies about a third percentage of the total area of the plurality of power gate devices, and
wherein the fourth power gate slice occupies about a fourth percentage of the total area of the plurality of power gate devices, wherein the second percentage is between the first percentage and the third percentage, and
wherein the fourth percentage is substantially larger than a sum of the first percentage, the second percentage, and the third percentage.

23. The apparatus of claim 22 comprises a level-shifter to generate a control signal, which is received by the individual driver.

24. The apparatus of claim 23, wherein the individual driver comprises a pull-up device coupled to the ungated power supply node, wherein the pull-up device is to receive the control signal.

25. The apparatus of claim 24, wherein the individual driver comprises a pull-down device coupled in series with a p-type device, wherein the pull-down device has a source terminal which is to receive the at least two bias voltages that are applied separated in time to gradually turn on the individual power gate circuitry, wherein the source terminal is the low power supply node.

26. The apparatus of claim 19, wherein each of the at least two bias voltages have a different voltage level between a power supply voltage level and a ground level.

27. The apparatus of claim 22, wherein the first percentage is about 3% of a total area of the plurality of power gate devices, wherein the second percentage is about 1% of the total area of the plurality of power gate devices, wherein the third percentage is about 2% of the total area of the plurality of power gate devices, and wherein the fourth percentage is about 94% of the total area of the plurality of power gate devices.

28. An apparatus comprising:
a power gate coupled to an ungated power supply rail and a gated power supply rail, wherein the gated power supply rail is coupled to a load; and
a driver to drive the power gate, wherein the driver is powered by power supply from the ungated power supply rail, wherein the driver includes a low power supply rail which is to receive bias voltages of different voltage levels, wherein the output of the driver swings between a voltage on the ungated power supply rail and voltage on the low power supply rail;
one or more multiplexers to selectively provide the bias voltages to the low power supply rail of the driver to adjust voltage swing of the output of the driver;
a finite state machine to generate a code; and
a decoder to decode the code and to generate a decoded code to control the one or more multiplexers.

29. The apparatus of claim 28, wherein the bias voltages are separated in time and cause the driver to gradually turn on or off the power gate.

* * * * *